United States Patent [19]

Kemi et al.

[11] Patent Number: 4,825,247
[45] Date of Patent: Apr. 25, 1989

[54] PROJECTION EXPOSURE APPARATUS

[75] Inventors: Ryuichi Kemi; Kazuo Takahashi, both of Kawasaki; Itaru Fujita, Yokohama, all of Japan

[73] Assignee: Canon Kabushiki Kaisha, Tokyo, Japan

[21] Appl. No.: 155,277

[22] Filed: Feb. 12, 1988

[30] Foreign Application Priority Data

Feb. 16, 1987 [JP] Japan .................... 62-031621
Mar. 2, 1987 [JP] Japan .................... 62-045296

[51] Int. Cl.⁴ ............................. G03B 27/52
[52] U.S. Cl. ........................... 355/55; 355/30; 355/53; 355/77
[58] Field of Search ............ 355/55, 30, 53, 43, 355/77

[56] References Cited
U.S. PATENT DOCUMENTS

| | | | |
|---|---|---|---|
| 4,506,977 | 3/1985 | Sato et al. | 355/55 X |
| 4,668,077 | 5/1987 | Tanaka | 355/30 |
| 4,687,322 | 8/1987 | Tanimoto et al. | 355/30 X |
| 4,699,505 | 10/1987 | Komoriya et al. | 355/53 X |
| 4,780,747 | 10/1988 | Suzuki et al. | 355/30 X |

Primary Examiner—Richard A. Wintercorn
Attorney, Agent, or Firm—Fitzpatrick, Cella, Harper & Scinto

[57] ABSTRACT

An exposure apparatus particularly suitable usable for the manufacture of semiconductor microcircuit is disclosed. The apparatus includes a specific arrangement that allows accurate and precise detection of any change in the imaging magnification and/or the image surface position of a projection optical system included in the projection exposure apparatus. Thus, with the present invention, a pattern can be projected upon a workpiece with improved accuracy.

13 Claims, 3 Drawing Sheets

PROJECTION EXPOSURE APPARATUS

FIELD OF THE INVENTION AND RELATED ART

This invention relates to a projection exposure apparatus particularly suitably usable in the manufacture of semiconductor devices such as integrated microcircuits.

In the field of reduction projection exposure apparatuses called "steppers" and used for the manufacture of integrated microcircuits, many attempts have been made to improve the imaging performance, alignment accuracy, throughput and otherwise in order to meet further increase in the degree of integration of the circuit device. One of important performances of such a stepper as required when it is used in a device manufacturing factory is the stability of the imaging characteristics of a projection optical system to the variation in the environmental conditions such as the temperature, pressure, humidity, etc. In this respect, attempts have been made to correct any error in the imaging characteristics due to the change in the environmental conditions on the basis of prediction of the imaging characteristics based on the detection of the temperature, pressure, humidity or otherwise around lens elements constituting the projection optical system.

With this method, however, it is difficult to compensate any change in the imaging characteristics and the expansion/contraction of a lens barrel resulting from the temperature increase in each lens element and/or in a gaseous fluid in a space between lens elements, which temperature increase might be caused by the application of light energy at the time of the projection exposure.

Attempts have been proposed in Japanese Laid-Open Patent Applications, Laid-Open Nos. Sho60-79357 and Sho60-79358, as an approach to this problem. According to these proposals, a conditioned gaseous fluid such as an air is circulated in a projection optical system so as to stabilize the imaging characteristics on the basis of the temperature control for the lens elements of the projection optical system. However, the provision of such a temperature adjusting device makes the exposure apparatus complicated. Further, the fluctuation in the circulating gaseous fluid within the projection optical system or the flow of the gaseous fluid, itself, easily causes vibration of the projection optical system which might deteriorate the imaging characteristics of the projection optical system. Additionally, it is difficult to follow rapid temperature increase in the projection optical system at the time of start of the exposure operation, with the result that there remains, as an "offset", a temperature difference with time before and after the start of the exposure.

SUMMARY OF THE INVENTION

It is accordingly a primary object of the present invention to provide a projection exposure apparatus by which at least one of the above-described problems can be solved.

It is another object of the present invention to provide a projection exposure apparatus in which any temperature variation in a projection optical system resulting from the application of a light energy can be detected precisely and, on the basis of this detection, any change in the imaging magnification and/or the imaging position of the projection optical system can be detected precisely.

Briefly, in accordance with one aspect of the present invention, there is provided a projection exposure apparatus having a projection optical system for projecting a pattern of an original upon a workpiece, wherein a closed space is formed at least in a portion between optical elements, such as lens elements, constituting the projection optical system and wherein any temperature variation within the projection optical system due to the application of a light energy is detected as the change in pressure or volume of a gaseous fluid contained in the closed space. On the basis of the change in pressure or volume, any change in the imaging characteristics of the projection optical system such as the imaging magnification, the imaging position (the position of an imaging plane) or otherwise, due to the temperature change in the projection optical system, can be detected precisely. In accordance with the detection of the change in the imaging characteristics, the position of the workpiece may be adjusted as desired so that the workpiece is positioned exactly in an optimum imaging plane of the projection optical system. The imaging magnification of the projection optical system may be adjusted, as desired, so that a desired magnification is established on the workpiece.

For the detection of the change in pressure, a portion of the boundary of the closed space may be formed by a thin film which is sensitively responsive to a pressure difference. Any change in the pressure within the closed space resulting from the temperature variation may be measured in terms of the displacement of the thin film. Thus, by converting the displacement into the pressure, the change in pressure of the gaseous fluid in the closed space can be detected.

For the detection of the change in volume, on the other and, the closed space may be communicated with an ambience by means of a suitable passageway a portion of which is closed by a magnetic fluid. Any change in volume of the gaseous fluid in the closed space may be measured or detected in terms of the position of the magnetic fluid in the passageway.

As compared with the conventional temperature controlling system wherein a temperature adjusting device is used to forcibly decrease the raised temperature of the projection optical system and the gaseous fluid around the projection optical system, the present invention does not use such a complicated temperature adjusting device. Any change in the imaging characteristics of the projection optical system, itself, can be detected and corrected on the basis of any change in pressure or volume in a closed space defined within the projection optical system. Thus, only the addition of a very simple and compact structure is necessary.

Further, according to another aspect of the present invention, all the spaces between optical components of a projection optical system, such as lens elements, may be maintained at a pressure substantially equal to an ambient pressure surrounding the projection optical system. Therefore, there is no possibility of undesirable distortion of optical components due to the pressure difference.

The present invention can provide significantly advantageous effects when it is applied to a projection exposure apparatus for projecting a circuit pattern of a mask or reticle upon a semiconductor wafer so as to photoprint the circuit pattern on a resist material with which the wafer is coated.

These and other objects, features and advantages of the present invention will become more apparent upon

DESCRIPTION OF THE PREFERRED EMBODIMENTS

Figure 1:
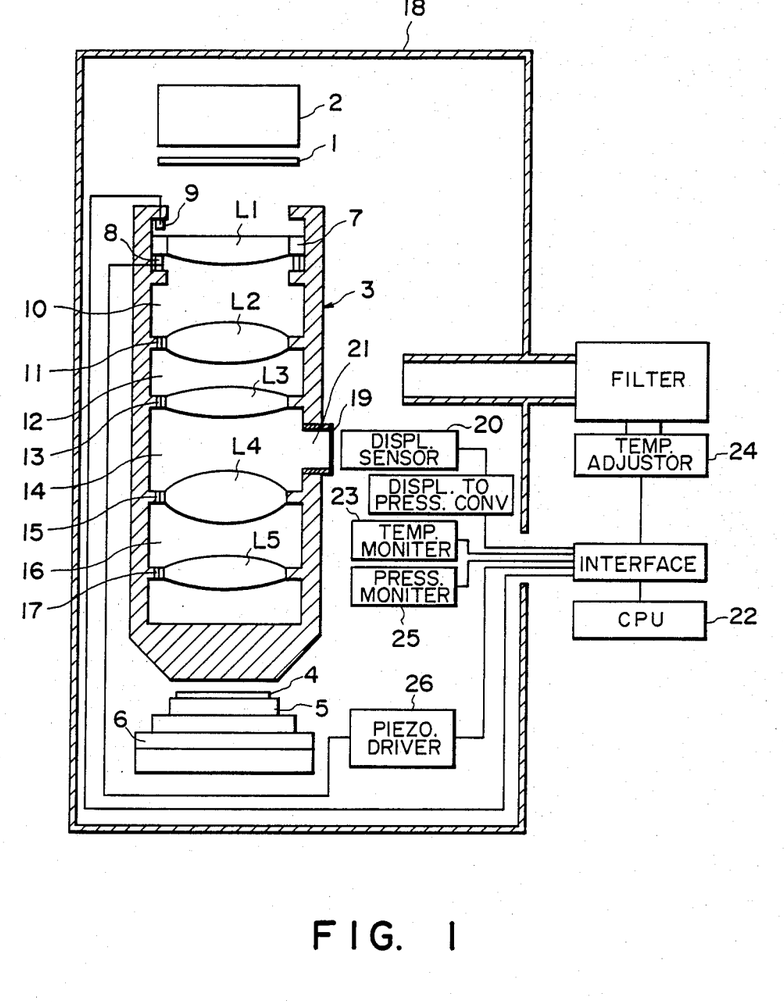
FIG. 1 is a schematic and diagrammatic view of a projection exposure apparatus according to an embodiment of the present invention.

Referring first to FIG. 1, there is shown a projection exposure apparatus according to one embodiment of the present invention.

As shown in FIG. 1, the apparatus includes an illumination system 2 for illuminating a reticle 1, from the above, so that a circuit pattern of the reticle 1 is transferred onto a wafer 4 which is a workpiece; a projection lens system 3 having a plurality of lens elements, for projecting the circuit pattern of the reticle 1 upon the wafer 4 in a reduced scale; a wafer chuck 5 for detachably holding the wafer 4 by vacuum suction; and an XYθZ stage 6 (hereinafter "wafer stage") which is adapted to move the wafer 4 upwardly and downwardly along an optical axis of the projection lens system 3 and horizontally in a plane perpendicular to the optical axis of the projection lens system.

The projection lens system 3 of the present embodiment comprises lens elements L1-L5 which are disposed with predetermined air spacings. Denoted at 7 in FIG. 1 is a lens holder adapted to hold the lens element L1 which is closest to the reticle 1. Piezoelectric device 8 is provided so as to displace the lens element L1 upwardly and downwardly along the optical axis of the projection lens system 3. Position sensor 9 which may be an eddy-current sensor is provided to detect the position of the lens holder 7 in the direction of the optical axis of the projection lens system 3. Reference numerals 10, 12, 14 and 16 denote the air spacings between the lens elements L1-L5, respectively. Ventilation ports 11, 13, 15 and 17 are provided to ventilate these air spacings 10, 12, 14 and 16, respectively. Denoted at 18 is a constant temperature chamber which is provided to maintain a constant temperature around the reticle 2, the projection lens system 3, the wafer 4, the wafer stage 6 and so on.

Denoted at 19 in FIG. 1 is a thin film which is attached to a portion of a lens barrel (depicted by hatching) of the projection lens system 3 so as to sealingly close this portion of the lens barrel. Capacitance type sensor 20 is provided to detect the amount of deformation of the thin film 1 which is deformable in response to any change in pressure within the projection lens system 3 resulting from any temperature change in the projection lens system 3. Denoted at 21 is a ventilation port an outer end of which is closed by the thin film 1. Denoted at 22 is a central processing unit (CPU). There are provided a temperature monitor 23 adapted to sense the temperature Ta around the projection lens system 3, a temperature controller 24, a pressure monitor 25 adapted to sense the pressure (atmospheric pressure) around the projection lens system 3, and a driver 26 for actuating the piezoelectric device 8. The driver 26 is electrically connected to the piezoelectric device 8 by way of a signal line so that the piezoelectric device 8 can be driven in accordance with signals from the driver 26.

The wafer stage 6 is adapted to be driven in response to signals from a stage driver (not shown) which is electrically connected to the CPU 22 by way of an interface and a signal line. Thus, the drive of the wafer stage 6 is controlled by the CPU 22.

Further, the position sensor 9, the displacement sensor 2,, the temperature monitor 23, the pressure monitor 25 and the temperature controller 24 are all connected to the CPU 22 by way of the interface and by means of respective signal lines. Thus, output signals of these sensors and monitors are supplied to the CPU 22 and processed thereby. The operation of the temperature controller 24 is controlled in response to signals from the CPU 22.

The position of the wafer 4 surface in the direction of the optical axis of the projection lens system 3 (i.e. in the direction of the Z-axis) may be detected by use of a suitable wafer position detecting device including air sensors or optical sensors which are well known in the art.

In operation, a wafer 4 which is going to be exposed is held by the chuck 5 by vacuum suction and, then, is moved and positioned by the wafer stage 6 with respect to an optimum imaging plane position (in the Z-direction) of the projection optical system 3 as well as an optimum exposure position (in the X-Y-θ direction) determined in respect to the projection optical system 3. For the stabilization of the ambient temperature surrounding the projection lens system 3 and the wafer stage 6, at the time of the exposure, the CPU 22 continuously reads or monitors any change in the ambient temperature by use of the temperature monitor 23 and supplies instruction signals to the temperature controller 24 so as to maintain an optimum temperature around the projection lens system 3 and so on. With regard to the variation in the pressure, the pressure monitor 25 is used to monitor the ambient pressure and, if there occurs a pressure change, the piezoelectric device 8 is driven by means of the driver 26 and in accordance with the output signal from the pressure monitor 25, so as to displace the lens element L1 upwardly or downwardly to establish an optimum or desired imaging magnification.

After all of these adjustments are accomplished, the circuit pattern of the reticle 1 is illuminated by a light supplied from the illumination system 2 such that an image of the circuit pattern is projected upon the wafer 4 in a reduced scale by the projection lens system 3. At this time, the ventilation ports 11, 13, 15 and 17 other than the ventilation port 21 are closed by a suitable shutter mechanism, not shown. The ventilation port 21 is closed by the thin film 19, as described hereinbefore.

Figure 2:
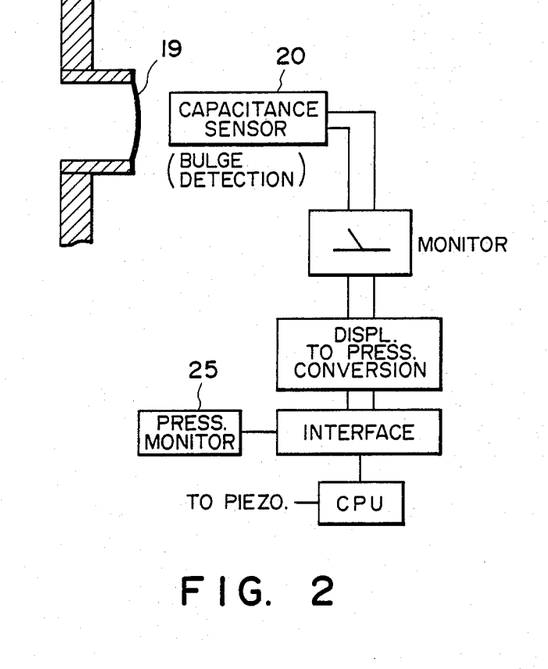
FIG. 2 is a fragmentary block diagram showing a temperature sensor used in the apparatus of the FIG. 1 embodiment.

FIG. 2 illustrates a temperature sensor usable in the present embodiment, for detecting any temperature change in the closed space within the projection lens system 3.

When the pressure in the closed space within the projection lens system 3 increases with the temperature increase in the projection lens system 3, the thin film 19 which is deformable and which forms a portion of the boundary between the closed space and the outside thereof is pressed and expanded such as shown in FIG. 2. The amount of such an expansion (displacement) is detected by the capacitance type sensor 20 and, by converting it into pressure, the change in pressure in the closed space (namely, the temperature change) can be detected.

On the basis of the thus detected pressure change, the change in the imaging magnification and the imaging plane position of the projection lens system 3 can be detected and, therefore, corrected or compensated. This will be described below in more detail.

The imaging magnification M and the image surface position F of the projection lens system 3 are the functions of the factors such as follows:

$$M = f(Pa, Ta, Te, Pe, X) \quad (1)$$

$$F = g(Pa, Ta, Te, Pe, X) \quad (2)$$

where
- Pa: ambient pressure around the projection lens system 3 (as detectable with monitor 25);
- Ta: ambient temperature around the projection lens system 3 (as detectable with monitor 23);
- Te: temperature in the projection lens system 3;
- Pe: pressure in the projection lens system 3 (as detectable with sensor 20); and
- X: interval between lens elements L1 and L2.

If the amounts of changes of these factors, from those at the time of the initial setting, are denoted by $\Delta Pa$, $\Delta Ta$, $\Delta Te$, $\Delta Pe$, $\Delta X$, then the amount of change ($\Delta M$) of the imaging magnification and the amount of change ($\Delta F$) of the image surface position can be determined by disregarding higher-order terms (not lower than second order) in a case where the amount of change in each factor is sufficiently small. Therefore, the changes $\Delta M$ and $\Delta F$ can be expressed as follows:

$$\Delta M = A_1 \Delta Pa + A_2 \Delta Ta + A_3 \Delta Pe + A_4 \Delta Te + A_5 \Delta X \quad (3)$$

$$\Delta F = B_1 \Delta Pa + B_2 \Delta Ta + B_3 \Delta Pe + B_4 \Delta Te + B_5 \Delta X \quad (4)$$

wherein $A_1$–$A_5$ and $B_1$–$B_5$ are constants which can be determined experimentally or theoretically.

The pressure Pe within the projection lens system 3 (the closed room thereof) can be expressed as follows, where the volume Ve thereof can be considered as being constant:

$$Pe = h(Te, Ve) \quad (5)$$

$$\Delta Pe = C_1 \Delta Te \quad (6)$$

wherein $C_1$ is a constant which can be determined experimentally or theoretically.

The amount of change $\Delta S$ of the thin film 19 is proportional to $\Delta Pe$, and $\Delta S$ is equal to a value obtained by subtracting the pressure within the projection lens system 3 from the ambient pressure. Therefore, the pressure change can be expressed as follows, by using a proportion constant K:

$$\Delta Pe = K \Delta S = K(Pa - Pe) \quad (7)$$

From equations (6) and (7), it follows that:

$$\Delta Te = K(Pa - Pe)/C_1 \quad (8)$$

The amount of change ($\Delta Te$) in temperature within the projection lens system 3 can be detected by use of the ambient pressure Pa around the projection lens system 3 and the pressure Pe within the projection lens system 3. Accordingly, it is seen that, in order to maintain the magnification change $\Delta M = 0$, from equations (3), (7) and (8), the distance $\Delta X$ between the lens elements L1 and L2 should satisfy the following relation:

$$\begin{aligned}\Delta X &= -\{A_1 \Delta Pa + A_2 \Delta Ta + A_3 \Delta Pe + A_4 \Delta Te\}/A_5 \quad (9)\\ &= -\{A_1 \Delta Pa + A_2 \Delta Ta + (A_3 + A_4)KPa \\ &\quad -(A_3 + A_4/C_1)KPe\} A_5\end{aligned}$$

Thus, to maintain $\Delta M = 0$, the value $\Delta X$ may be calculated by the CPU 22 on the basis of the output signals from the temperature monitor 23, the pressure monitor 25 and the sensor 20 and, then, the piezoelectric device 8 may be driven so as to change the interval between the lens elements L1 and L2 by an amount corresponding to $\Delta X$.

Further, from equations (7) and (8), the amount of change ($\Delta F$) of the image surface position can be expressed as follows:

$$\Delta F = (B_1 - B_5 A_1/A_5)\Delta Pa + (B_2 - B_5 A_2/A_5)\Delta Ta + \quad (10)$$

$$(B_3 + B_4/C_1 - A_3 B_5/A_5 - A_4 B_5/A_5)KPa -$$

$$(B_3 + B_4 + B_5 A_3 + B_5 A_4/A_5 C_1)KPe$$

It is seen therefrom that, in order to bring the wafer 4 position into coincidence with the optimum image surface position of the projection lens system 3, the wafer stage 6 may be moved so as to displace the wafer 4 upwardly or downwardly along the optical axis of the projection lens system 3, in accordance with the value of $\Delta F$ and the output signal from the above-described wafer position detecting device, the value $\Delta F$ being calculated by the CPU 22.

In the manner described hereinbefore, correction or compensation may be made to any change in the imaging magnification and/or any change in the image surface position which results from a change in pressure around the projection lens system, a change in temperature around the projection lens system and a change in pressure within the projection lens system due to a change in temperature therewithin caused by the absorption of a light energy at the time of the projection exposure.

Figure 3:
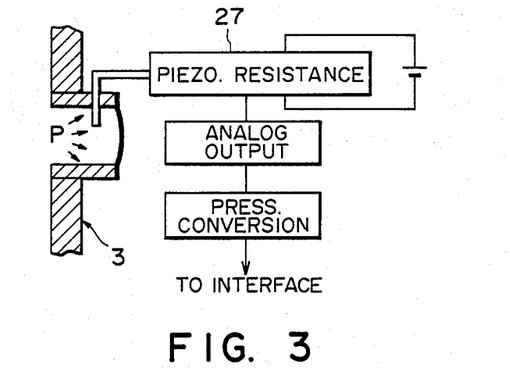
FIG. 3 is a fragmentary block diagram showing a modified form of a temperature sensor usable in the apparatus of the FIG. 1 embodiment.

FIG. 3 shows a case wherein the pressure is detected by use of a piezoelectric resistance effect of a semiconductor. This pressure measuring method utilizes a phenomenon that a sensor chip included in piezoelectric resistance pressure switch 27 shows resistance variation (distorted resistance) in response to the change in pressure in the closed space within the projection lens system 3. Very high accuracy measurement is attainable in this example. Also, the pressure switch 27 itself can be very compact.

While, in the present embodiment, the lens element L1 is displaced for the correction of the magnification of the projection lens system 3, the reticle 1 may be displaced in the direction of the optical axis of the projection lens system 3. Further, the magnification may be corrected by changing the refractive index of at least a portion of the air spacings 10, 12 and 16 within the projection lens system 3.

Further, in place of moving the wafer stage 6 so as to bring the wafer 4 position into coincidence with the optimum image surface position of the projection lens system 3, the reticle 1 and the projection lens system 3 may be moved as a unit in the direction of the optical axis of the projection lens system 3. Additionally, as in the case of the correction of the magnification, the refractive index of at least a portion of the air spacings 10, 12 and 16 of the projection lens system 2 may be changed to correct the image surface position of the projection lens system 3. These adjustment methods are usable also in an embodiment of the present invention which will be described later.

Figure 4:
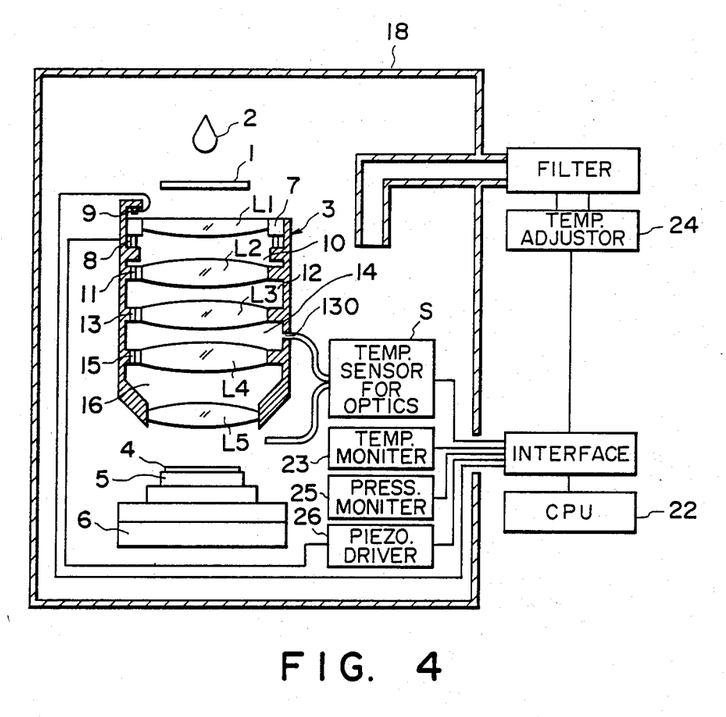
FIG. 4 schematic and diagrammatic view of a projection exposure apparatus according to another embodiment of the present invention.

FIG. 4 shows a projection exposure apparatus according to another embodiment of the present invention. In FIG. 4, the same reference numerals as of those used in the FIG. 1 embodiment are assigned to corresponding or similar elements.

In FIG. 4, a circuit pattern formed on a reticle 1 is illuminated by an illumination system 2 and is projected, in a reduced scale, upon a wafer 4 by means of a projection lens system 3. The wafer 4 is held by a wafer chuck 5 by vacuum suction which is supported by an $XY\theta Z$ stage 6 (hereinafter "wafer stage"). The wafer stage is movable to displace the wafer 4 along an optical axis of the projection lens system 3 and in a plane perpendicular to the optical axis of the projection lens system 3. The projection lens system 3 comprises a plurality of lens elements L1-L5 which are disposed with predetermined air spacings. It should be noted that the lens element L1 is held by a lens holder 7 and is made movable along the optical axis of the projection lens system 3 under the influence of a piezoelectric device 8. Thus, it has a function of adjusting the imaging magnification of the projection lens system 3. The position of the lens holder 7 in the direction of the optical axis of the projection lens system 3 is detected by a position sensor 9 which may be an eddy-current sensor.

The air spacings 10, 12, 14 and 16 between the lens elements L1-L5 are communicated by means of ventilation ports 11, 13 and 15. Further, these air spacings 10, 12, 14 and 16 are sealed from the outside, with an exception of a ventilation port 130 which is communicated with a temperature sensor S provided to sense the temperature of the lens system.

In the neighborhood of the projection lens system 3, there are mounted a temperature monitor 23 and a pressure monitor 25. On the basis of the detections made by these monitors, a central processing unit 14 (CPU) operates to control the temperature in a constant-temperature chamber 18 with the aid of a temperature controller 24, so as to maintain a constant temperature condition around the projection lens system 3, the reticle 1, the wafer 4 and the wafer stage 6.

Various operations of various components described above are controlled under the influence of the CPU 22, essentially in the same manner as has been described with reference to the foregoing embodiment.

Figures 5, 6:
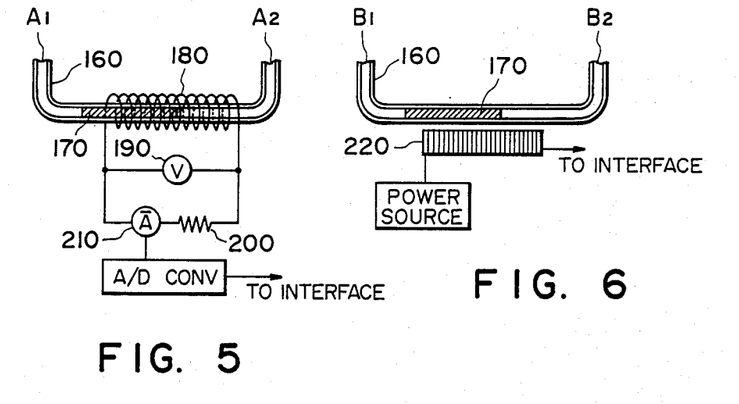
FIG. 5 is a schematic view showing a temperature sensor used in the apparatus of the FIG. 4 embodiment.
FIG. 6 is a schematic view of a modified form of a temperature sensor usable in the apparatus of the FIG. 4 embodiment.

FIG. 5 shows an example of the temperature sensor S usable in the FIG. 4 embodiment, for sensing the temperature related to the optical system. In this example, the sensor comprises a detecting tube 160 one end ($A_1$) of which is communicated with a ventilation port 130 and another end ($A_2$) of which is communicated with a space surrounding the projection lens system 3. A portion of the detecting tube 160 is filled with a magnetic fluid 170, as illustrated. Under the influence of this magnetic fluid 170, the pressure in each of the air spacings between the lens elements can be maintained substantially equal to the ambient pressure around the projection lens system 3. Further, there are provided a detection coil 180, a voltmeter 190, a resistor 200 and a high-frequency constant voltage source 210. The inductance of the detecting coil 180 is determined definitely in accordance with the position of the magnetic fluid 170. Accordingly, from the output of the voltmeter 190, any change in the position of the magnetic fluid 170 resulting from a change in volume of the gaseous fluid within the projection lens system 3 can be detected.

For the exposure operation using the projection exposure apparatus of the FIG. 4 embodiment, the imaging magnification M and the image surface position F are functions of the factors such as follows:

$$M = f(Pa, Ta, Te, X) \tag{11}$$

$$F = g(Pa, Ta, Te, X) \tag{12}$$

The factors (parameters) in equations (11) and (12) denotes the physical quantities described with reference to the foregoing embodiment. Comparing equations (11) and (12) of the present embodiment with equations (1) and (2) in the foregoing embodiment, it is seen that the factor Pe used in equations (1) and (2) is not included in equations (11) and (12). This is because, in the projection exposure apparatus of the present embodiment as described hereinbefore, the pressure Pe within the projection lens system 3 is set and maintained so as to be equal o the ambient pressure Pa around the projection lens system 3, namely Pa=Pe.

Where, as in the foregoing embodiment, the amounts of changes in regard to the various factors are denoted by $\Delta Pa$, $\Delta Ta$, $\Delta Te$ and $\Delta X$ and when the constants determined experimentally or theoretically are denoted by $A_{11}$, $A_{12}$, $A_{13}$, $A_{14}$, $B_{11}$, $B_{12}$, $B_{13}$ and $B_{14}$, then the amount of change ($\Delta M$) of the imaging magnification and the amount of change ($\Delta F$) of the image surface position of the projection lens system 3 can be expressed as follows:

$$\Delta M = A_{11}\Delta Pa + A_{12}\Delta Ta + A_{13}\Delta Te + A_{14}\Delta X \tag{13}$$

$$\Delta F = B_{11}\Delta Pa + B_{12}\Delta Ta + B_{13}\Delta Te + B_{14}\Delta X \tag{14}$$

The pressure within the projection lens system 3 is equal to the ambient pressure Pa around the projection optical system 3. Accordingly, when the volume of the gaseous fluid within the projection lens system 3 is denoted by Ve, the volume Ve as well as the mount of change $\Delta\Delta Ve$) of it can be expressed as follows:

$$Ve = h(Te, Pa) \tag{15}$$

$$\Delta Ve = C_{11}\Delta Te + C_{12}\Delta Pa \tag{16}$$

wherein $C_{11}$ and $C_{12}$ are constants which can be determined experimentally or theoretically.

The change $\Delta Ve$ satisfies the relation $$\Delta Ve = D_{11}\Delta S \tag{17}$$

when the proportional constnt in relation to the amount of displacement ($\Delta S$) of the magnetic fluid 170 is denoted by $D_{11}$. Therefore, from equations (16) and (17), it follows that:

$$\Delta Te = (D_{11}\Delta S - C_{12}\Delta Pa)/C_{11} \tag{18}$$

Namely, the amount of change ($\Delta Te$) in temperature within the projection lens system 3 can be detected by use of the output $\Delta S$ of the temperature sensor S and the output $\Delta Pa$ of the pressure monitor 25 which is provided in the neighborhood of the projection lens system 3. Accordingly, it is seen that, in order to retain $\Delta M = 0$ in equation (13), the following relation should be satisfied, as derived from equation (18):

$$\begin{aligned}\Delta X &= -\{A_{11}\Delta Pa + A_{12}\Delta Ta + A_{13}\Delta Te\}/A_4 \\ &= -\{(A_{11} - A_{13}C_{12}/C_{11})Pa + A_{12}\Delta Ta \\ &\quad + (A_{13}D_{11}/C_{11})\Delta S\}/A_{14}\end{aligned} \tag{19}$$

It is seen therefrom that the error in the magnification of the projection lens system can be corrected by energizing the piezoelectric device 8 so as to change the interval between the lens elements L1 and L2 by an amount $\Delta X$. The character $\Delta Ta$ denotes the output of the temperature monitor 23 disposed close to the projection lens system 3.

From equations (4), (8) and (9), the amount of change ($\Delta F$) of the image surface position can be expressed as follows:

$$\begin{aligned}\Delta F &= \{B_{11} - (A_{11}B_{14}/A_{14}) - (B_{13} - A_{13}B_{14}/A_{14})C_2/C_1\}\Delta Pa \\ &\quad + \{B_{12} - (A_{12}B_{14}/A_{14})\}\Delta Ta \\ &\quad + \{B_{13} - (A_{13}B_{14}/A_{14})\}D_{11}/C_{11} \cdot \Delta S\end{aligned} \tag{20}$$

Namely, the image of the circuit pattern is formed at a position which is deviated by $\Delta F$ from a preset image surface position. Accordingly, the circuit pattern can be exactly imaged upon the wafer 4 by displacing the wafer 4, by means of the wafer stage 6, upwardly or downwardly along the optical axis of the projection lens system 3 on the basis of a positional signal representing the wafer 4 position and by an amount corresponding to $\Delta F$ as can be calculated in accordance with equation (20).

Although there may not be caused large temperature variation around the projection lens system 3, due to the function of the temperature controller 24, it may be necessary to use the parameter $\Delta Ta$ in equations (19) and (20), i.e. use of the output signals from the temperature monitor 23, for assuring accurate calculation of $\Delta X$ and $\Delta F$.

In accordance with the present embodiment, as described hereinbefore, correction or compensation can be made to any change in the imaging magnification of the projection lens system 3 and/or any change in the image surface position of the projection lens system 3 which results from a change in the ambient pressure around the projection lens system 3, a change in the temperature around the projection lens system 3, a change in temperature within the projection lens system 3 caused by the absorption of a light energy at the time of the projection exposure, and so on.

FIG. 6 shows a modified form of the temperature sensor S usable in the FIG. 4 embodiment. In the example shown in FIG. 6, a switch array 220 comprising arrayed switches disposed in parallel to and close to a detecting tube 160 is used to detect the position of a magnetic fluid 170, having been introduced into the detecting tube 160. In this example, it is easy to suppress the noise. Also, there is no necessity of analog-to-digital conversion.

In the embodiments described hereinbefore, the closed space is defined by lens elements themselves However, in place of such structure, a plurality of flat parallel glass plates may be disposed to form a closed space in a region between lens elements or, alternatively, to define such a space on the path of the light used for the exposure. In such case, any change in pressure or volume within the thus formed closed space may be measured.

Further, in the embodiments described hereinbefore, an air is used as a gaseous fluid filling the closed space within the projection lens system 3. However, in place of this, a nitrogen gas, a helium gas or otherwise may be used as the gaseous fluid in the closed space.

In accordance with the present invention, as has hitherto been described, the effect of absorption of a light energy, in a projection lens system, upon the optical characteristics of the lens system such as the imaging magnification, the image surface position, etc. can be measured or detected easily and very precisely with a simple and compact structure. Therefore, desired imaging characteristics of the projection lens system can be retained with suitable correction or compensation. Thus, the present invention can provide a projection exposure apparatus which is continuously capable of projecting a circuit pattern of a reticle or otherwise upon a workpiece such as a wafer, very accurately.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a stage for carrying thereon a workpiece;
   an illumination system for illuminating an original with a light;
   a projection optical system having a plurality of optical elements, for projecting upon the workpiece a pattern of the original being illuminated with the light;
   monitoring means operable to monitor a change in temperature of a gaseous fluid contained in a closed space formed between at least two of said optical elements of said projection optical system; and
   correcting means operable to correct the magnification of said projection optical system on the basis of an output signal from said monitoring means.

2. An apparatus according to claim 1, wherein said monitoring means is adapted to detect the temperature change in said gaseous fluid on the basis of a change in pressure of said gaseous fluid.

3. An apparatus according to claim 1, wherein said monitoring means is adapted to detect the temperature change in said gaseous fluid on the basis of a change in volume of said gaseous fluid.

4. An apparatus according to claim 1, wherein said projection optical system includes a plurality of lens elements, one of said lens elements closest to the original being made movable along the optical axis of said projection optical system, and wherein said magnification correcting means includes driving means operable to move said movable lens element on the basis of an output signal of said monitoring means.

5. An apparatus according to claim 1, further comprising second monitoring means operable to monitor a change in pressure around said projection optical system and wherein said magnification correcting means is adapted to correct the magnification of said projection optical system on the basis of an output signal from said second monitoring means.

6. An apparatus according to claim 1, further comprising driving means effective to move said stage along the optical axis of said projection optical system, said driving means being operable to move said stage in accordance with an output signal from said monitoring means to bring the position of the workpiece into coincidence with an image surface position of said projection optical system.

7. A projection exposure apparatus, comprising:
a stage for carrying thereon a workpiece;
an illumination system for illuminating an original with a light;
a projection optical system having a plurality of optical elements, for projecting upon the workpiece a pattern of the original being illuminated with the light;
monitoring means operable to monitor a change in temperature of a gaseous fluid contained in a closed space formed between at least two of said optical elements of said projection optical system; and
adjusting means operable in accordance with an output signal of said monitoring means, so that an image surface position of said projection optical system and the position of the workpiece are made coincident with each other.

8. An apparatus according to claim 7, wherein said monitoring means is adapted to detect the temperature change in said gaseous fluid on the basis of a change in pressure of said gaseous fluid.

9. An apparatus according to claim 7, wherein said monitoring means is adapted to detect the temperature change in said gaseous fluid on the basis of a change in volume of said gaseous fluid.

10. An apparatus according to claim 7, wherein said adjusting means includes driving means effective to move said stage along an optical axis of said projection lens system.

11. An apparatus according to claim 7, further comprising second monitoring means operable to monitor a change in pressure around said projection optical system and wherein said adjusting means is operable in accordance with an output signal from said second monitoring means so as to bring the image surface position of said projection optical system and the position of the workpiece into coincidence with each other.

12. A method, usable in a projection exposure system for projecting a pattern of a mask upon a wafer by use of a projection lens system, for correcting a magnification of the projection lens system, said method comprising the steps of:
detecting a change in temperature in a closed space formed within the projection lens system; and
correcting the magnification of the projection lens system in accordance with the detection of the temperature change.

13. A method, usable in a projection exposure system for projecting a pattern of a mask upon a wafer by use of a projection lens system, for positioning the wafer with respect to an image surface of said projection lens system, said method comprising the steps of:
detecting a change in a closed space formed within the projection lens system;
detecting the position of the wafer with respect to a direction of an optical axis of said projection lens system; and
positioning the wafer with respect to the image surface of said projection lens system, in accordance with the detection of the temperature change in the closed space and the detection of the position of the wafer in the direction of the optical axis.

* * * * *

UNITED STATES PATENT AND TRADEMARK OFFICE
CERTIFICATE OF CORRECTION

PATENT NO. : 4,825,247

DATED : April 25, 1989

INVENTOR(S) : RYUICHI KEMI, ET AL.   Page 1 of 2

It is certified that error appears in the above-identified patent and that said Letters Patent is hereby corrected as shown below:

SHEET 1

FIG. 1, " TEMP MONITER"  should read  -- TEMP MONITOR--.

and

" PRESS MONITER"  should read  -- PRESS MONITOR--.

SHEET 3

FIG. 4, " TEMP MONITER"  should read  -- TEMP MONITOR--.

and

" PRESS MONITER"  should read  -- PRESS MONITOR--.

COLUMN 2

Line 35, "and," should read --hand,--.

COLUMN 3

Line 16, "FIG. 4" should read --FIG. 4 is a--.

COLUMN 4

Line 20, "sor 2,," should read --sor 20,--.

UNITED STATES PATENT AND TRADEMARK OFFICE
CERTIFICATE OF CORRECTION

PATENT NO. : 4,825,247
DATED : April 25, 1989
INVENTOR(S) : RYUICHI KEMI, ET AL.

Page 2 of 2

It is certified that error appears in the above-identified patent and that said Letters Patent is hereby corrected as shown below:

COLUMN 6

Line 22, "$-\{A_1 \Delta Pa + A_2 \Delta Ta + (A_3 + A_4)KPa - (A_3 + A_4/C_1)KPe\} A_5$" should read -- $-\{A_1 \Delta Pa + A_2 \Delta Ta + (A_3 + A_4/C_1)KPa - (A_3 + A_4/C_1)KPe\}/A_5$ --.

COLUMN 8

Line 41, "equal o" should read --equal to--.
Line 60, "mount" should read --amount--.
Line 61, "$\Delta \Delta Ve)$" should read --$(\Delta Ve)$--.

COLUMN 9

Line 5, "constnt" should read --constant--.

Signed and Sealed this

Fifteenth Day of May, 1990

Attest:

HARRY F. MANBECK, JR.

*Attesting Officer*  *Commissioner of Patents and Trademarks*